United States Patent [19]

Kumagai et al.

[11] Patent Number: 4,954,685
[45] Date of Patent: Sep. 4, 1990

[54] HEATING FURNACE FOR SEMICONDUCTOR WAFERS

[75] Inventors: Hiromi Kumagai; Kaoru Sato; Yoshio Imai, all of Tokyo, Japan

[73] Assignee: Tokyo Electron Limited, Tokyo, Japan

[21] Appl. No.: 223,343

[22] Filed: Jul. 25, 1988

[30] Foreign Application Priority Data

Jul. 31, 1987 [JP] Japan .............................. 62-191673
Oct. 28, 1987 [JP] Japan .............................. 62-272403

[51] Int. Cl.⁵ .............................................. F27B 5/14
[52] U.S. Cl. ................................................ 319/390
[58] Field of Search ............ 219/390, 405, 411, 552, 219/553, 210; 373/127, 114

[56] References Cited

U.S. PATENT DOCUMENTS

| | | | |
|---|---|---|---|
| 1,837,178 | 12/1931 | Benner | 373/127 |
| 2,145,324 | 1/1939 | Stauss | 219/390 |
| 3,009,601 | 11/1961 | Matsch | 220/423 |
| 3,170,018 | 2/1965 | Lewis | 373/114 |
| 3,240,915 | 3/1966 | Carter | 219/405 |
| 3,354,257 | 11/1967 | Lang | 219/390 |
| 3,385,921 | 5/1968 | Hampton | 219/390 |
| 3,525,452 | 8/1970 | Hofmann | 219/210 |
| 3,644,655 | 2/1972 | Vollmer | 373/114 |
| 4,313,993 | 2/1982 | McGlory | 428/178 |
| 4,325,694 | 4/1982 | Bergman | 373/137 |
| 4,666,760 | 5/1987 | Hasuda | 428/215 |
| 4,754,377 | 6/1988 | Wenman | 362/373 |

FOREIGN PATENT DOCUMENTS

| | | |
|---|---|---|
| 54-43650 | 9/1975 | Japan . |
| 54-81270 | 6/1979 | Japan . |
| 55-100995 | 7/1980 | Japan . |
| 60-25140 | 2/1985 | Japan . |
| 1466999 | 3/1977 | United Kingdom ............. 219/390 |

*Primary Examiner*—Teresa J. Walberg
*Attorney, Agent, or Firm*—Oblon, Spivak, McClelland, Maier & Neustadt

[57] ABSTRACT

A heating furnace for semiconductor wafers having a heater arranged around a core tube, layers of a heat insulating material made of a porous heat insulating material or ceramic fibers arranged around the heater, and layers of a heat reflecting material arranged in the layers of the heat insulating material.

2 Claims, 6 Drawing Sheets

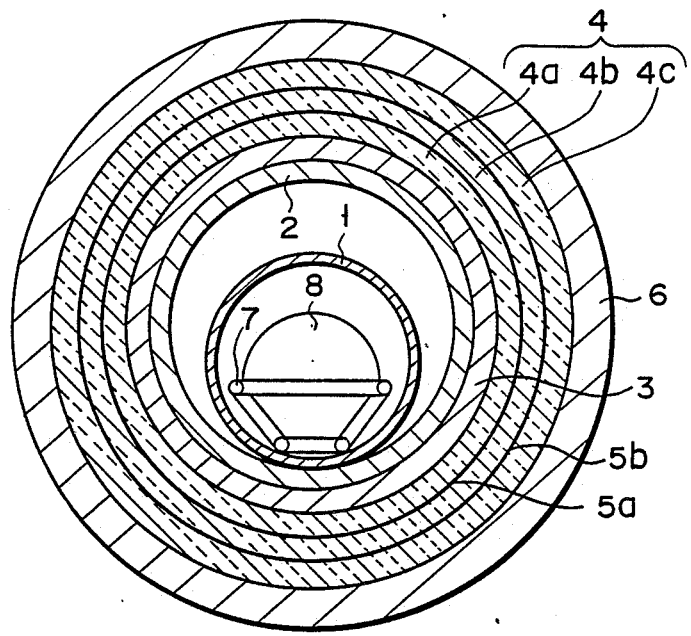
F I G. 2
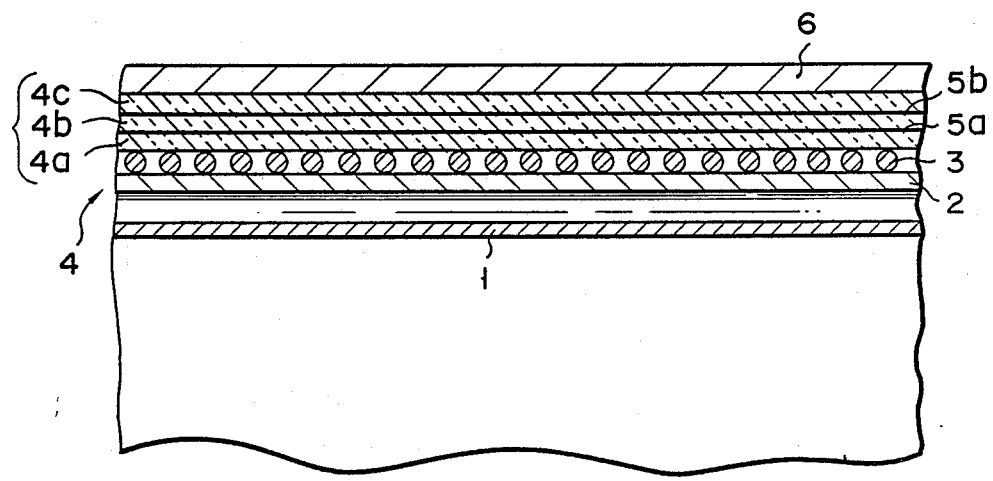
F I G. 3

HEATING FURNACE FOR SEMICONDUCTOR WAFERS

BACKGROUND OF THE INVENTION

1. Field of the Invention

The present invention relates to a heating furnace and more particularly, a heating furnace most suitable for heat treatments such as the thermal diffusion and the CVD (chemical vapor deposition) applied to semiconductor wafers (which will be hereinafter referred to only as wafer or wafers) and the like.

2. Description of the Related Art

The heating furnace is used in the process of manufacturing semiconductor devices. The heating furnace is intended in this case to apply heat treatments such as the thermal diffusion and the CVD to wafers. The temperature in this heating furnace is likely to change every time when the wafers which are to be treated come in and out of the furnace. Therefore, a plurality of wafers are mounted on a wafer boat. This wafer boat is inserted into the furnace and the plural wafers are heat-treated at the same time. The influence which is exerted on the wafers by the temperature change in the furnace is made as trifling as possible by this process. As the result, the throughput of the heat treatment applied to the wafers is enhanced. The temperature in the furnace is usually set from several hundreds to thousand and several hundreds degrees.

As described above, the heating furnace is asked to have temperature uniform in the whole furnace. The conventional heating furnace has the following arrangement, for example, for this purpose. The core tube is made of a material such as quartz. The soaking tube is arranged round the core tube. The heater is arranged round the soaking tube. Layers of heat insulating material are arranged to enclose the heater. The heat insulating material is porous, for example.

In other word, the heater is enclosed by the insulating material, low in thermal conductivity, in the case of the conventional heating furnace. Heat discharge from the core tube to outside is thus reduced and made uniform. As the result, temperature is made uniform in the core tube.

In order to apply uniform heat treatment to the wafers, however, it is needed that temperature change is held $\pm 0.5°$ C. in the whole furnace. However, the above-described conventional heating furnace could not have such a high uniform temperature set inside it.

The heater which is a component for forming the conventional heating furnace comprised turning its heat transfer line round the core tube like a coil along the longitudinal direction of the core tube. However, it is difficult for this heater to carry out uniform heating in the core tube over the whole length thereof.

Therefore, the heater is divided into three, that is, left, center and right zones. Each of these zones is provided with a temperature control means. Further, the turning density of the heat transfer line is made high at those portions thereof which correspond to both ends of the core tube. Heat discharge to the outside of the core tube is thus restrained (see Japanese Utility Model Publication Sho No. 54-43650).

When the heater is arranged in this manner, the uniformly heating zone formed in the core tube is extremely shorter as compared with the whole length of the core tube. This forces a plurality of wafers to be heat-treated in the short heating zone. As the result, many wafers cannot be uniformly heat-treated at one time. The throughput is thus lowered.

Preliminarily-opened Japanese Utility Model Application Sho No. 60-25140 discloses a heating furnace wherein the heater is divided into five zones along the longitudinal direction of the reaction tube and a certain voltage is applied to every zone. The uniformly heating zone can be made longer as compared with that in the heater which is divided into three zones. However, the cost of manufacturing this heating furnace becomes higher because each of the five zones needs the temperature control means.

SUMMARY OF THE INVENTION

An object of the present invention is to provide a heating furnace capable of fully restraining the amount of heat discharged at the time of heating and achieving efficient and uniform heating in the furnace.

Another object of the present invention is to provide a heating furnace, low in cost, capable of making the uniformly heating zone sufficiently long and achieving efficient heating in the furnace.

A heating furnace of the present invention includes a heater arranged round the core tube, layers of heat insulating material arranged outside the heater, and layers of heat reflecting material arranged in the layers of heat insulating material.

The layer of heat reflecting material may be formed on that inner face of the heat insulating material layer which is opposed to the core tube. The heat reflecting material is vapor-deposited on the inner face of the heat insulating material layer in this case, for example, to thereby form a thin film which can serve as the layer of reflecting material.

Or the reflecting material layer may be embedded in the heat insulating material layer. Plural layers of heat insulating material are laminated one upon the other and the layer of reflecting material is sandwiched between the adjacent heat insulating material layers in this case.

The reflecting material layer is preferably made of thin aluminum film, several tens or hundreds microns thick, for example, when temperature in the core tube is lower than $600°$ C. It is preferably made of gold or platinum, for example, when temperature in the core tube is higher than $600°$ C. The refractory ability of the reflecting material layer may be enhanced by embedding the reflecting material layer in the heat insulating material layer at a certain depth thereof.

Or the reflecting material layer may be formed in the heat insulating material layer over the whole area and along the longitudinal direction thereof. Or it may be selectively formed in the heat insulating material layer at certain areas and along the longitudinal direction thereof.

The heat insulating material layer is preferably made of a porous heat insulating material such as ceramic fibers.

A soaking tube may be interposed between the core tube and the heater. The soaking tube is preferably made of a material such as silicon carbide.

The heater comprises turning a heating line round the core tube along the longitudinal direction thereof. It is preferable that the turning density of the heating line is made high at that portion thereof which corresponds to the center portion of the core tube, adding to present both end portions of the core tube, and low at portions between the center portion and above both end portions of the core tube. It is also preferable that the turning density of the heating line has a 5-15% more number of turnings at the high density portion than that at the low density portions.

According to a heating furnace of the present invention, heat created by the heater is discharged outside through radiation at the surface of heat insulating material layer as well as heat conduction. The amount of heat discharged by radiation is relatively large in the case of the porous heat insulating material layer (or material having numerous cavities). This is apparent from FIGS. 4A and 4B, for example, which are graphs showing relations between the heat conductivity and the bulk density of heat insulating material layer. The heat insulating material layer in this case is made of ceramic fibers, for example. It can be understood from FIGS. 4A and 4B that heat discharge is made higher by radiation at the surface of the heat insulating material layer as heating temperature becomes higher. The heat conductivity and the temperature are related every bulk density of ceramic fibers as shown in FIG. 5.

On the other hand, the heat reflecting material which is a thin aluminum film is higher in heat conduction and discharges a larger amount of heat through heat conduction. However, this heat reflecting material discharges an extremely smaller amount of heat through radiation.

Therefore, the present invention uses a structure of arranging the reflecting material layer on the inner face of or in the heat insulating material layer. Heat discharge by heat conduction is restrained by the heat insulating material layer. In addition, heat discharge by radiation is restrained by the heat reflecting material layer. As the result, the amount of discharge of heat created by the heater can be reduced to the utmost extent. Therefore, power consumption of the heater can be made extremely small and heat treatment can be applied to objects with high efficiency. It may be arranged that the turning density of the heating line is made high at that portion thereof which corresponds to the center portion of the core tube, adding to present both end portions of the core tube, and low at portions between the center portion and above both end portions of the core tube. It is preferable that the number of turnings of the heating line at that portion of the heating line which corresponds to the center portion of the core tube is made 5-15% more than that at those portions of the heating line which correspond to both ends of the core tube. When this heater is used, the uniformly heating zone in the core tube can be made longer.

BRIEF DESCRIPTION OF THE DRAWINGS

FIG. 2 is a horizontally sectioned view showing the heating furnace in FIG. 1.

FIG. 3 is a vertically sectioned and enlarged view showing the heating furnace in FIG. 1.

DETAILED DESCRIPTION OF THE PREFERRED EMBODIMENTS

Some embodiments of the present invention will be described with reference to the accompanying drawings.

EXAMPLE 1

Figure 1:
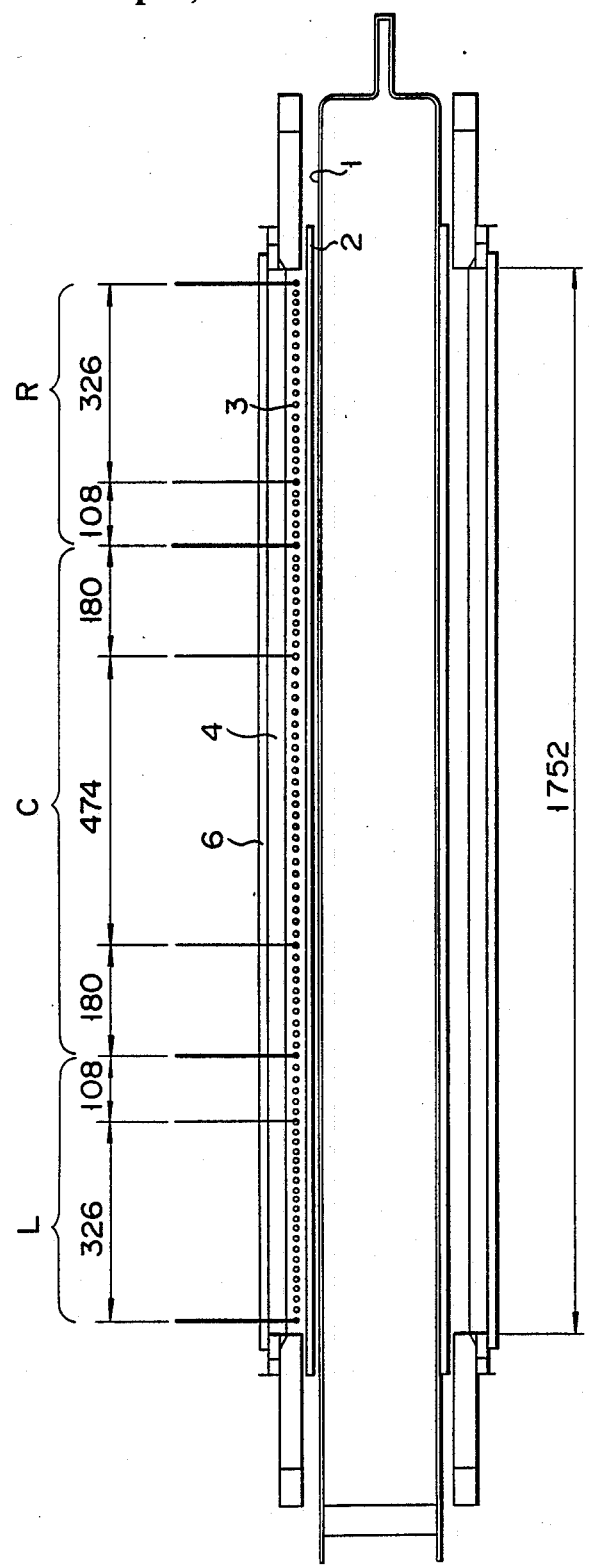
FIG. 1 shows an example of the heating furnace according to the present invention.
Figure 4B:
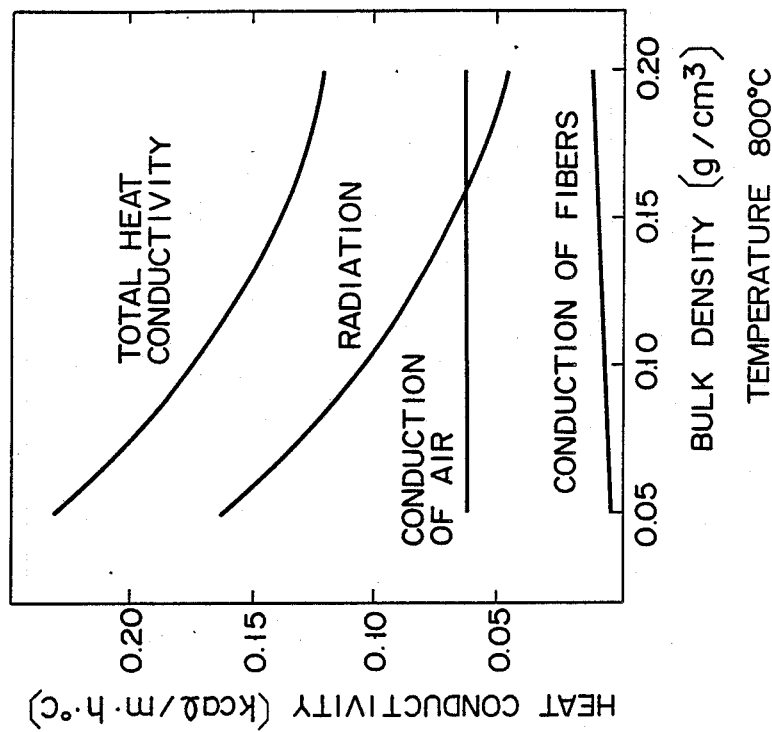
FIGS. 4A and 4B are characteristic views showing the relation between the heat conductivity and the bulk density of a heat insulating material layer made of ceramic fibers.
Figure 4A:
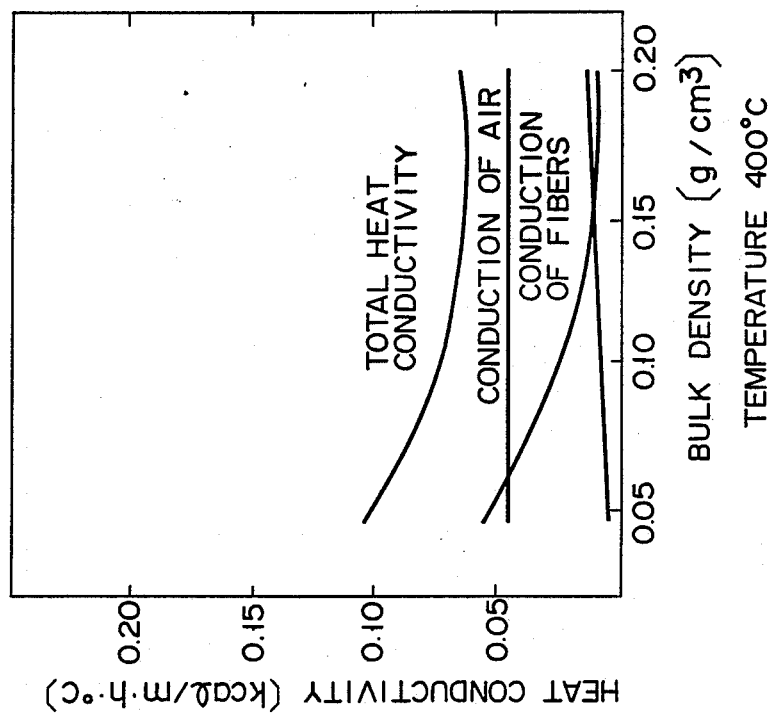
Figure 5:
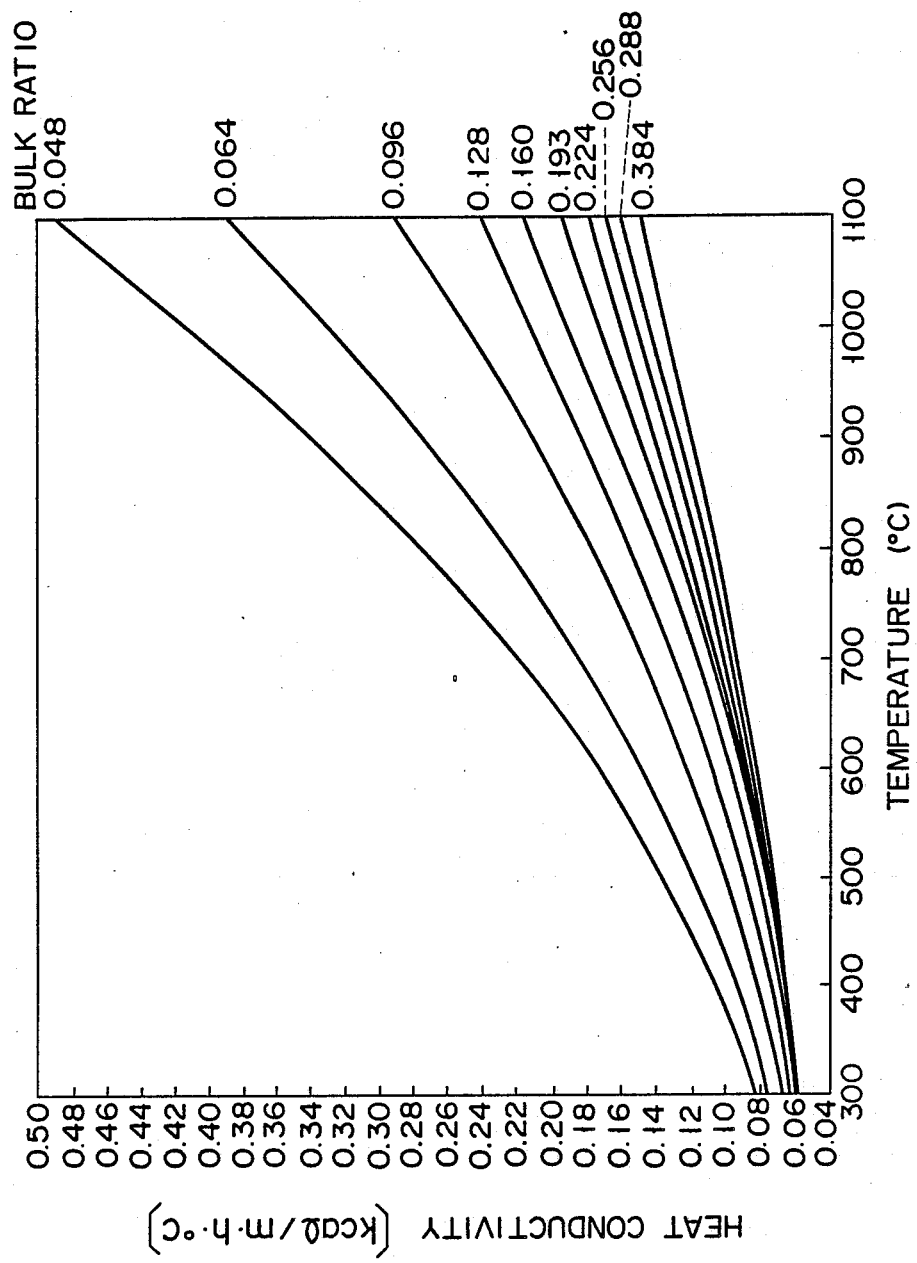
FIG. 5 is a characteristic view showing how heat conductivity and temperature are related every bulk density of the heat insulating material layer made of ceramic fibers.

FIG. 1 is an explanatory view showing the construction of a heating furnace embodied according to the present invention. Numeral 1 represents a core tube. Core tube 1 is made of quartz, for example. Core tube 1 has a cylindrical shape, an outside diameter of 180 mm, and a length of 1752 mm. It is preferable that the outside diameter of core tube 1 be within the range of 100-350 mm. The length of core tube 1 is preferably within the range of 1500-2000 mm. Core tube 1 is housed in soaking tube 2. Heater 3 is arranged outside soaking tube 2. Heater 3 comprises a heating line which is coiled around soaking tube 2. Heat insulating material layers 4 are arranged outside heater 3 to enclose soaking tube 2. Heat insulating material layers 4 are made of a porous heat insulating material.

Heat insulating material layers 4 are of the three-layer structure, as shown in FIGS. 2 and 3. Reflecting material layer 5a is interposed between innermost and intermediate heat insulating material layers 4a and 4b while reflecting material layer 5b is interposed between intermediate and outermost heat insulating material layers 4b and 4c. The thickness of each of reflecting material layers 5a and 5b is set about several thousands angstroms. Reflecting material layers 5a and 5b may be made of thin aluminum films, for example. When the temperature in the core tube reaches a level higher than 600° C., heat reflecting material layers 5a and 5b are preferably made of a material such as platinum having an excellent refractory ability. OR inner heat reflecting material layer 5a may be omitted. Heater case 6 is located outside heat insulating material layers 4.

Heater 3 is connected to a control means (not shown). Heater 3 is divided into three OR zones: right, center, and left (R, C and L), along the longitudinal direction of core tube 1. Heater 3 is designed to independently control the temperatures at each of these three zones.

The inside of core tube 1 is heated at several hundreds or thousand and several hundreds degrees, for example, by heater 3. Wafer boat 7, on which wafers 8 to be treated are mounted, is housed in core tube 1. Wafer boat 7 is made of quartz, for example. A plurality of wafers 8 are arranged on wafer boat 7 in such a way that their main faces oppose one another. Wafers 8 are heated in core tube 1 and subjected to thermal diffusion or CVD (Chemical Vapor Deposition) to form a thin film on wafers 8.

Heat created by heater 3 is transmitted to wafers 8 through soaking tube 2 in this case. While wafers 8 are being subjected to a heat treatment, some of the heat in soaking tube 2 tends to diffuse outwardly, passing through soaking tube 2 and heat insulating material layers 4. However, this diffusion of heat is partially restrained from escaping to the outside by the heat insulation of heat insulating material layers 4. Further, two heat reflecting material layers 5a and 5b are embedded in heat insulating material layers 4. Therefore, most of the heat which passes through innermost heat insulating material layer 4a is reflected by first heat reflecting material layer 5a so that the heat is caused to return to the inside of core tube 1. Even if the heat escape through first reflecting material layer 5a and intermediate heat insulating material layer 4b, it will be reflected by second heat reflecting material layer 5b and caused to return to the inside of core tube 1. Thus, most of the heat created by heater 3 remains within the inside of core tube 1. Only an extremely small amount of the heat created by heater 3 escapes to the outside. Heat loss caused by radiation through heat insulating material layers 4a–4c can almost completely be recovered by heat reflecting material layers 5a and 5b. As the result, the power consumption of heater 3 can be reduced to the utmost extent, thereby enabling the heat treatment applied to wafers 8 to be carried out with extremely high efficiency.

The heater, which is a component for example 1 of the heating furnace, may be arranged so that the number of coilings of the heating line is set as follows to make the heating zone uniformly longer in core tube 1. Namely, the turning density of the heating line is made high at that portion thereof which corresponds to the center portion of the core tube, adding to present both end portions of the core tube, and low at portions between the center portion and above both end portions of the core tube. It is preferable that the heating line is 5–15% more densely coiled at that portion of the heating line which corresponds to the center portion of the core tube than at those portions of the heating line which correspond to the areas on each side of the center portion of core tube 1.

Another example of the heating furnace which will be described below is intended to confirm what effect can be achieved when the uniform heating zone is made longer by applying the heater having the above-described arrangement.

EXAMPLE 2

Figure 6:
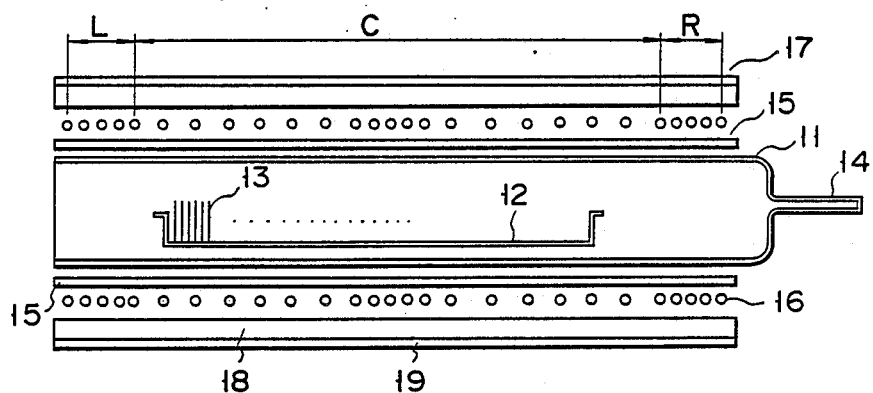
FIG. 6 shows a second example of the heating furnace according to the present invention.

FIG. 6 is an explanatory view showing the structure of another heating furnace embodied as example 2 according to the present invention. Numeral 11 represents a core tube. Core tube 11 is made of a material such as quartz and silicon carbide, for example. Core tube 11 is made to have a cylindrical shape, a diameter of 172 mm, and a length of 1702 mm, for example. One end of core tube 11 can be freely opened and closed to bring in and out wafer boat 12. 100–150 sheets of wafers 13 as objects to be treated are mounted on wafer boat 12. Wafers 13 are mounted at certain intervals on and along the longitudinal direction of wafer boat 12. Gas supply tube 14 is connected to the end of core tube 11 for supplying reaction gas thereinto. Soaking tube 15 made of silicon carbide, for example, is arranged around the outer face of core tube 11. Heating line 16 is coiled around soaking tube 15, keeping it without contacting soaking tube 15. Heating line 16 is divided into left, center, and right zones (L, C and R). Outgoing lines 17 are extended from both ends of each of zones L, C and R and connected to a power source (not shown). Heating line 16 is closely turned round the center portion of center zone C and it is roughly turned round both ends of center zone C. It is closely turned round right and left zones R and L. This is intended to prevent temperature fall at that portion of core tube 1 where wafer boat 12 is brought in and out and also at the reaction gas supply section thereof. Heat insulating material layer 18 is arranged outside heating line 16 to prevent heat from being discharged outside. Cooling system 19 is arranged outside heat insulating material layer 18 to cool the latter. Cooling system 19 can prevent anything located outside the heating furnace from being heated.

100–150 pieces of 6-inch wafers 13, for example are mounted on wafer boat 12. Wafer boat 12 is brought in core tube 11. The soft landing technique, for example, is used as the carrier means. Wafer boat 12 is set in core tube 11 at a certain position thereof. The inside of core tube 11 is made air-tight. Power of 9.80KW is supplied from the power source (not shown) to heating line 16. This power of 9.80KW is supplied to zones L, C and R of heating line 16 at a heat input ratio of 1:2.35:1 = left zone L:center zone C: right zone R.

Figure 7:
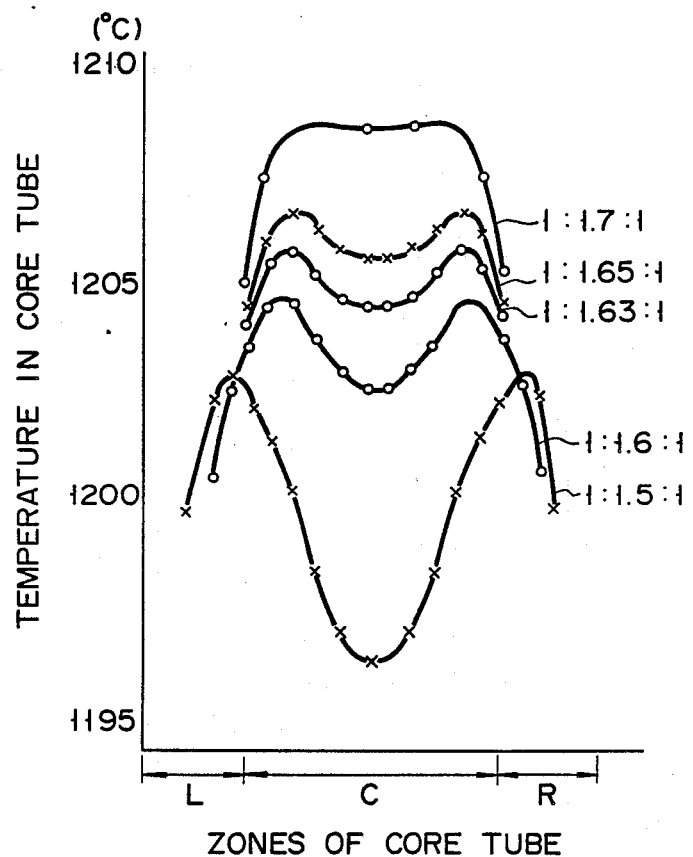
FIGS. 7 and 8 are characteristic views showing the relation between temperature in the core tube and each of zones of the core tube in the case of the conventional heating furnace.
Figure 8:
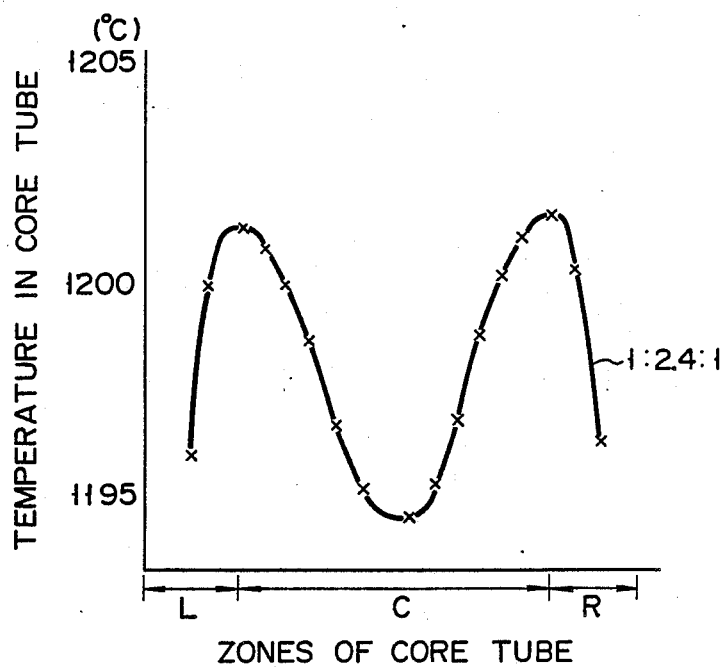

In the case of the conventional heating furnace, the heating line is divided into left zone L of 434 mm, center zone C of 834 mm, and right zone R of 434 mm along the longitudinal direction of the core tube. The power of 9.80KW is supplied to the whole of the heating line. As shown in FIG. 7, the heat input ratio of zones L, C and R is changed from 1:1.5:1 to 1:1.7:1, repeating tries and errors, to make the uniformly heating zone longer in the core tube. The power is supplied to zones L, C and R of the heating line at the heat input ratio of 1:1.7:1 under which the uniformly heating zone can be made the longest. The number of turnings of the heating line is made higher at both ends of center zone C than that at the center portion of center zone C to thereby restrain heat from being discharged outside. The uniformly heating zone of about 838 mm is obtained at and near center zone C in this case. However, this uniformly heating zone is quite short as compared with the whole length of the core tube. Left zone L is set 326 mm, center zone 1050 mm, and right zone 326 mm to solve this problem. When the power of 9.80KW is supplied to the heating line, the length of the uniformly heating zone is made large at a heat input ratio of L:C:R=1:2.4:1, as shown in FIG. 8.

Figure 9:
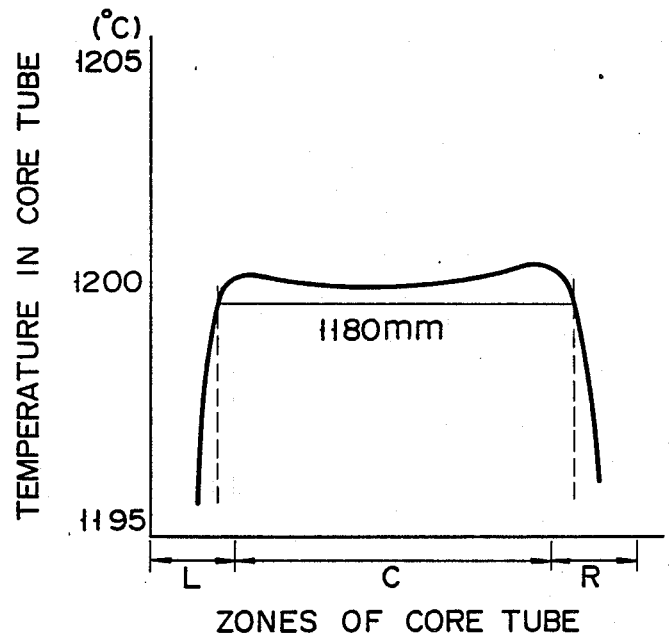
FIGS. 9 is a characteristic view showing the relation between temperature in the core tube and each of zones of the core tube in the case of the heating furnace shown in FIG. 6.

However, irregularity of about ±3° C. exists when the uniformly heating zone has this length. It is therefore arranged that the number of turnings of heating line 16 is made more at both end zones L and R and it is also made about 5–15% more at the center portion of center zone C than that at both ends of center zone C, as shown in FIG. 6. The same total power of 9.80KW as cited above is supplied to this heating line 16 to heat it at the heat input ratio of L:C:R=1:2.4:1. The length of the uniformly heating zone whose irregularity is ±0.5° C. becomes about 1180 mm, as shown in FIG. 9. This length of the uniformly heating zone thus obtained is about 40% larger, as compared with that of the conventional uniformly heating zone which is about 838 mm. As the result, a larger number of wafers can be treated as a unit, as compared with those treated in the conventional heating furnace, thereby enhancing the throughput.

Wafers 13 are heated in this manner. Reaction gas is supplied through gas supply tube 14 and wafers 13 are heat-treated. The characteristic shown in FIG. 9 is at a uniform heat of about 1200° C. This set temperature was changed to 800° C. and 1400° C. and measurement was carried out. As the result, a large length of the uniformly heating zone having the substantially same characteristic as in the case of 1200° C. could be formed at 800° C. and 1400° C. It has been thus confirmed that a large length of the uniformly heating zone can be formed at any desired temperature. When the heat input ratio is made large at left zone L or right zone R, temperature at center zone usually falls lower than those at both ends zones. However, the outside discharge of heat is restrained, keeping the core tube under thermal stability. When the center portion of center zone C is heated under this state, temperature rises at the center portion of center zone C, thereby enabling the uniformly heating characteristic to be obtained. In order to heat this center portion, the turning density of heating line 16 is made high at both ends and center of the core tube while it is made low at other portions thereof.

The number of turnings of heating line 16 is set 26 at left zone L, 46 at center zone C and 26 at right zone R, for example. Keeping these numbers of turnings of heating line 16, the turning density of heating line 16 is made high at both ends and center portion of the core tube. Or the number of turnings of heating line 16 is set 26 at left zone L, 43 at center zone C and 26 at right zone R. The number of turnings of heating line 16 is thus made about 5-15% more or increased by three turnings at the center of the core tube. As the result, the same setting of local temperature as described above is made possible only by changing the structure of heating line 16. This is quite simpler as compared with the case where temperature is controlled at plural sections, using plural power sources. Plural power sources and plural temperature control means are thus made unnecessary, thereby enabling the heating furnace to be manufactured at a lower cost.

Although the heat treatment of wafers has been described in the above examples of the heating furnace, the present invention can be applied to any of heat treatments such as thermal diffusion, oxidation and CVD. Further, the present invention is not limited to the heat treatment of semiconductor wafers but to any of objects to be heated with the same effect.

According to example 2 as described above, the turning density of heating line 16 is made higher at the center of core tube 11 than that at the other portions thereof. As the result, the outside discharge of heat is restrained by setting temperature higher at both ends of core tube 11, thereby holding core tube 11 under thermal stability. Temperature is thus raised at the center portions to turning heating line 16 round core tube 11 more closely at the center thereof. Internal temperature in core tube 11 can be thus made uniform over a larger area in core tube 11. Therefore, a larger number of objects can be thus treated under the same condition through one heat treatment process, thereby enhancing the throughput.

Further, plural power sources and plural temperature control means are made unnecessary at both ends and center of the core tube, thereby enabling the heating furnace to be manufactured at a lower cost.

What is claimed is:

1. A heating furnace for semiconductor wafer comprising a heating line which is coiled around a core tube, its coiling density, being varied along the longitudinal axis of the furnace in the order of intermediate density-low density-high density low density-intermediate density, layers of a heat insulating material or of ceramic fibers arranged around said heating line, and a plurality of heat reflecting material layers laminated at certain intervals within said heat insulating material layers.

2. A heating furnace for semiconductor wafers comprising a heating line which is coiled around a core tube and is 5-15% more densely coiled at that portion thereof which corresponds to the center of said core tube than at those portions thereof which are adjacent to the center of said core tube, its coiling density being varied along the longitudinal axis of the furnace in the order of intermediate density-low density-high density-low density-intermediate density, layers of a heat insulating material or of ceramic fibers arranged around said heating line, and at least one layer of a heat reflecting material being a thin film vapor deposited on the inner face of said heat insulating material.

* * * * *

UNITED STATES PATENT AND TRADEMARK OFFICE
CERTIFICATE OF CORRECTION

PATENT NO. : 4,954,685

DATED : SEPTEMBER 4, 1990

INVENTOR(S) : HIROMI KUMAGAI ET AL.

It is certified that error appears in the above-identified patent and that said Letters Patent is hereby corrected as shown below:

On the title page item [30]:
    In the Foreign Application Priority Data, please delete "October 28, 1987  JAPAN ................62-272403".

Signed and Sealed this

Seventeenth Day of March, 1992

Attest:

HARRY F. MANBECK, JR.

Attesting Officer

Commissioner of Patents and Trademarks